United States Patent [19]

Ohba et al.

[11] Patent Number: 5,008,629
[45] Date of Patent: Apr. 16, 1991

[54] FREQUENCY SYNTHESIZER

[75] Inventors: Motoi Ohba, Yokohama; Hiroyuki Yabuki, Kawasaki; Mitsuo Makimoto, Yokohama, all of Japan

[73] Assignee: Matsushita Electric Industrial Co., Ltd., Japan

[21] Appl. No.: 369,408

[22] Filed: Jun. 20, 1989

[30] Foreign Application Priority Data

Jun. 20, 1988 [JP] Japan ............................. 63-151619
Jul. 22, 1988 [JP] Japan ............................. 63-184330

[51] Int. Cl.$^5$ ........................ H03L 7/00; H03B 19/00
[52] U.S. Cl. ................................ 328/14; 328/140; 307/271; 331/14; 331/18
[58] Field of Search ................... 328/14, 15, 25; 307/271; 331/14, 18, 25

[56] References Cited

U.S. PATENT DOCUMENTS

| | | | |
|---|---|---|---|
| 3,982,199 | 9/1976 | Green | 328/14 |
| 4,654,859 | 3/1987 | Kung et al. | 331/18 |
| 4,673,892 | 6/1987 | Miyashita et al. | 331/14 |
| 4,841,255 | 6/1989 | Ohba et al. | 331/14 |
| 4,871,981 | 10/1989 | Franklin | 331/25 |

FOREIGN PATENT DOCUMENTS

| 248022 | 12/1985 | Japan | 331/14 |
|---|---|---|---|
| 0016616 | 1/1987 | Japan | 331/14 |

Primary Examiner—Timothy P. Callahan
Attorney, Agent, or Firm—Lowe, Price, LeBlanc, Becker & Shur

[57] ABSTRACT

A frequency synthesizer for use in a high-frequency multichannel radio apparatus and so on. More particularly, a phase-locked loop (PLL) type frequency synthesizer which can perform a pulling process at high speed. Namely, a frequency synthesizer of the present invention can effect a pulling process at high speed by putting input signals to a phase comparator into a state in which the input signals are in phase with each other in an intermittent operation mode and can have strong resistance to noises by providing a 1-bit data latch and gate circuits in a data inputting portion thereof and synthesizing strobe signals at the time of inputting data thereto.

2 Claims, 4 Drawing Sheets

FREQUENCY SYNTHESIZER

BACKGROUND OF THE INVENTION

1. Field of the Invention

This invention generally relates to a frequency synthesizer for use in a multichannel radio apparatus and more particularly to an improved frequency synthesizer which can perform a pulling process thereof at high speed and can substantially lower power consumption thereof in comparison with the prior art.

2. Description of the Related Art

A frequency synthesizer is an important component of a multichannel radio or wireless apparatus. Thus, it is a problem of great concern in the multichannel radio apparatus to realize high-speed pulling characteristics thereof. Further, it is also a problem of great concern in a mobile radio apparatus to achieve low power consumption therein. Hereinafter, a conventional digital type phase initializing circuit with reference to FIG. 4 will be described.

In FIG. 4, reference numeral 1 indicates a base oscillator outputting signals of which frequencies are divided by a reference frequency divider 2. Usually, a temperature compensating crystal oscillator (TCXO) is used as the base oscillator. The thus obtained signals are inputted into a phase comparator (P.C.) 3 as reference signals. Further, in this figure, reference numeral 4 indicates a voltage-contolled oscillator (hereunder abbreviated as VCO) outputting signals of which frequencies are divided by a variable frequency divider 5. Moreover, output signals of the variable frequency divider 5 are also inputted into the phase comparator 3. An output signal of the phase comparator 3 corresponds to a phase difference between the output of the reference frequency divider 2 and that of the variable frequency divider 5 and are further inputted through a charge pump (C.P.) 6 and a low-pass filter 7 into a control terminal of the VCO 4 whereup a control operation of the phase difference is effected. By this operation, stabilized outputs of the VCO 4, which are synchronized with the difference signal, are obtained. Furthermore, the frequency of the output signal of the VCO 4 can be changed by changing a frequency division ratio of the variable frequency divider 5. This method is applied to the multichannel radio apparatus.

Further, for the purpose of the lowering power consumption of the frequency synthesizer, it is devised that the power is turned off when unnecessary. This is generally called an intermittent operation. In case where the above described frequency synthesizer is intermittently operated, it is needed for matching of the system and owing to effects of the intermittent operation to stabilize the frequency within a short period of time. In order to realize this, the following means is devised. That is, when the power is turned off in the intermittent operation, control voltage for providing signals having necessary or desired frequency is held by a low-pass filter 7. At that time, charge to be held may be changed in accordance with the state of the charge pump 6. Thus, a loop switch 8 is provided between the charge pump 6 and the low-pass filter 7 and is opened when the power is turned off. On the other hand, when the power is turned on and the loop switch 8 is closed, input signals to the phase comparator 3 (that is, the output signal of the reference frequency divider 2 and that of the variable frequency divider 5) have the same frequency but are different in phase from each other and therefore a phase difference signal may be generated by the phase comparator 3. Thereby, there may be caused change in frequency among an output of the phase comparator 3 and the input signals thereto. Thus, it takes much time to stabilize frequency. As a countermeasure to this, is devised a system in which the reference frequency divider 2 is initialized by an output of the variable frequency divider 5, thereby putting the signal outputted from the variable frequency divider 5 and that outputted from the reference frequency divider 2 into a state in which these signals are in phase with each other and thus forming a loop in the frequency synthesizer. Further, reference numeral 9 indicates a control circuit for controlling the reference frequency divider 2 and the loop switch 8 in the manner as described above.

This conventional system, however, has a drawback that the output signals of the frequency dividers 2 and 5 cannot be sufficiently in phase with each other and thus it takes time for performing a pulling process (which comprises a pull-in and lock-in sub-processes). Furthermore, this conventional system has another drawback that, in case of a low-voltage operation, data may be changed under the influence of noises superposed on signals inputted into data inputting portion.

Thus, the present invention is accomplished to eliminate the above described drawbacks of the conventional phase initializing circuit.

SUMMARY OF THE INVENTION

It is accordingly an object of the present invention to provide an improved frequency synthesizer which can perform a pulling process at high speed and increase the magnitude of resistance to noises.

To achieve the foregoing object and in accordance with the present invention, there is provided a frequency synthesizer for use in a multichannel radio apparatus which includes a first oscillator for outputting a signal having a reference frequency, a first frequency divider for dividing the frequency of the signal outputted from the first oscillator, a second oscillator for outputting a signal having a desired or wanted frequency, a second frequency divider for dividing the frequency of the signal outputted by the second oscillator by a variable number, a phase comparator for comparing the phase of the signal outputted from the first frequency divider with that of the signal outputted from the second frequency divider, a charge pump for converting an output signal of the phase comparator and outputting the converted signal as an integrator drive signal and an integrator for integrating the output signal of the charge pump and controlling the second oscillator and which further includes a first gate circuit between the first oscillator and the first frequency divider, a second gate circuit between the second oscillator and the second frequency divider or within the second frequency divider, a third gate circuit between the phase comparator and the integrator, a shift register having more than 3 bits into which the signal outputted from the first or second frequency divider and a frequency synthesizer controlling signal are inputted, a control circuit composed of two gate circuits into which the signal outputted from the phase comparator and that outputted from the shift register are inputted and a frequency division ratio setting circuit for controlling a first signal inputted from a strobe input terminal and a second signal outputted from a 1-bit data latch by a gate circuit, for inputting the first and second signals into a loading terminal of a N-bit data latch to input a signal outputted from a N-bit shift register into the N-bit data latch and for controlling frequency division ratio of the first and second frequency dividers.

Thereby, strobe signals having time or phase difference with each other can be synthesized and thus a frequency synthesizer having strong resistance to noises can be obtained.

Further, at the time of activation, reset signals are supplied to an input terminal and a state maintaining terminal of the phase comparator. Thereby, the phase comparator of the frequency synthesizer according to the present invention can perform a initial phase-locking function, which will be described hereunder, at the time of activation thereof.

BRIEF DESCRIPTION OF THE DRAWINGS

Other features, objects and advantages of the present invention will become apparent from the following description of a preferred embodiment with reference to the drawings in which like reference characters designate like or corresponding parts throughout several views, and in which.

DETAILED DESCRIPTION OF PREFERRED EMBODIMENT

Figure 1:
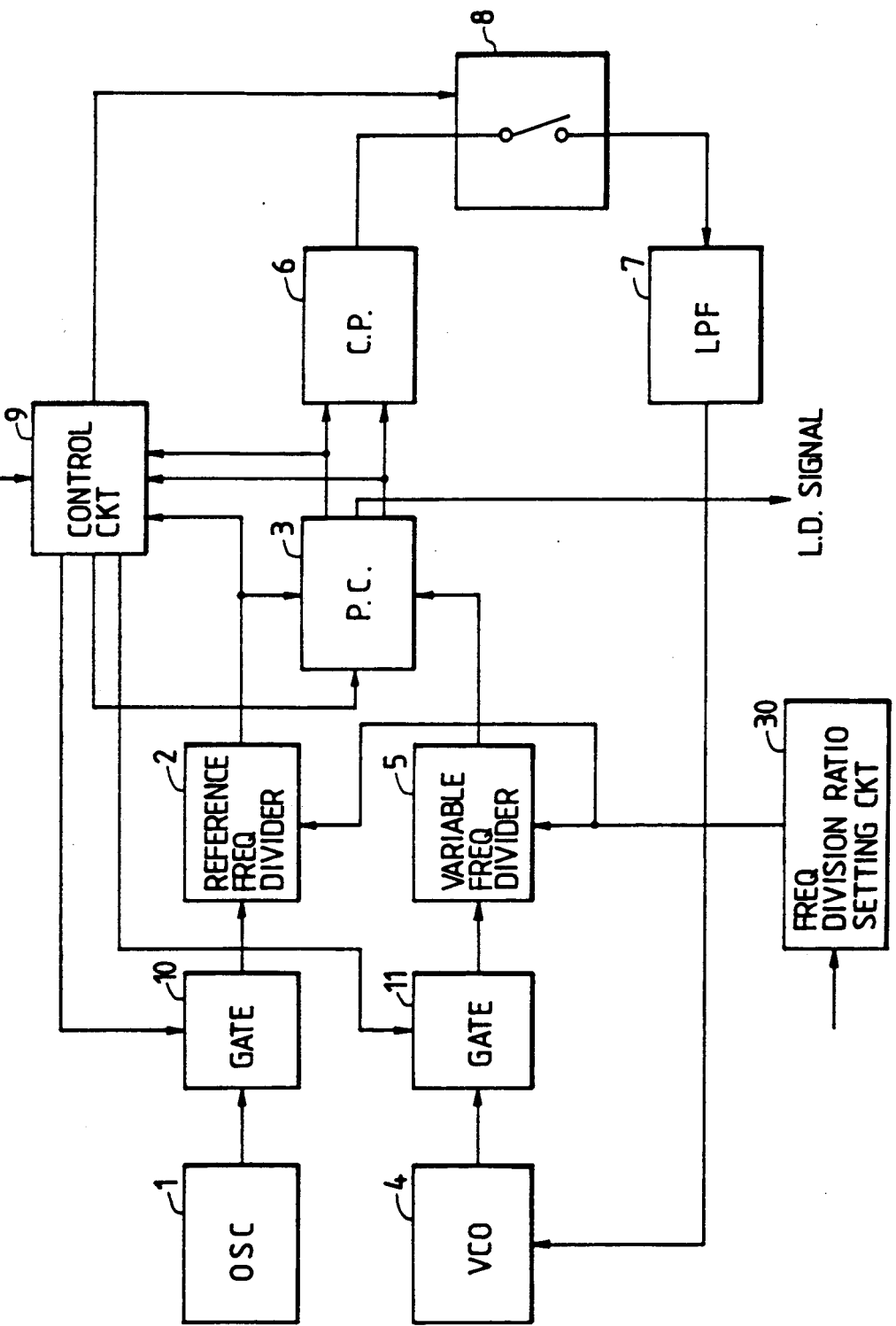
FIG. 1 is a schematic block diagram showing the construction of a frequency synthesizer according to the present invention.

FIG. 1 shows the construction of a frequency synthesizer embodying the present invention. In this figure, reference numeral 1 indicates a base oscillator; 2 a reference frequency divider for inputting a signal outputted by the base oscillator 1; 4 a VCO; and 5 a variable frequency divider for inputting a signal outputted from the VCO 4. Further, reference numeral 3 indicates a phase comparator for inputting signals outputted from the reference frequency divider 2 and from the variable frequency divider 5; 6 a charge pump for inputting a signal outputted by the phase comparator 3; 7 a low-pass filter for performing an integrating function and for inputting a signal outputted by the charge pump; 8 a loop switch provided between the charge pump 6 and the low-pass filter 7; 10 a gate circuit provided between the base oscillator 1 and the reference frequency divider 2; 11 another gate circuit provided between the VCO 4 and the variable frequency divider 5; and 9 a control circuit for inputting an intermittent control signal, a signal outputted form the reference frequency divider 2 or the variable frequency divider 5 and another signal outputted from by the phase comparator 3 and for controlling the loop switch 8 ad the gate circuits 10 and 11. Furthermore, reference numeral 30 indicates a frequency division ratio setting circuit for setting frequency division ratio of the reference and variable frequency dividers 2 and 5 in the frequency synthesizer of this embodiment.

Hereinafter, an operation of the embodiment constructed as above described will be explained.

First, operations other than the intermittent operation (hereunder referred to as ordinary operations) of this frequency synthesizer are similar to ordinary operations of the conventional frequency synthesizer. On the other hand, in the intermittent operation of this frequency synthesizer, the phase of an output signal of each of the gate circuits 10 and 11, which control the input of the reference frequency divider 2 and that of the variable frequency divider 5, respectively, is regulated by a period of time corresponding to an error of phase (that is, a phase difference presenting therebetween) by the control circuit 9, into which the output signal of the phase comparator 3 and the intermittent control signal are inputted, such that the two input signals of the phase comparator 3 are put into a state in which the input signals are in phase with each other. Further, the control circuit 9 produces a loop control signal of which the rise time is shorter than that of the intermittent signal by a constant period of time. The loop switch 8 is directly controlled by this loop control signal. In this way, the phase of each of the input signals to the phase comparator 3 is regulated at the beginning of the intermittent control operation such that a period of time required for the pulling process is relatively short. Incidentally, such a function of regulating the phase of each input to the phase comparator of the frequency synthesizer at the beginning of the intermittent operation is referred to as an initial phase-locking function herein. Thereafter, this frequency synthesizer is further put into an ordinary operation mode.

Figure 2:
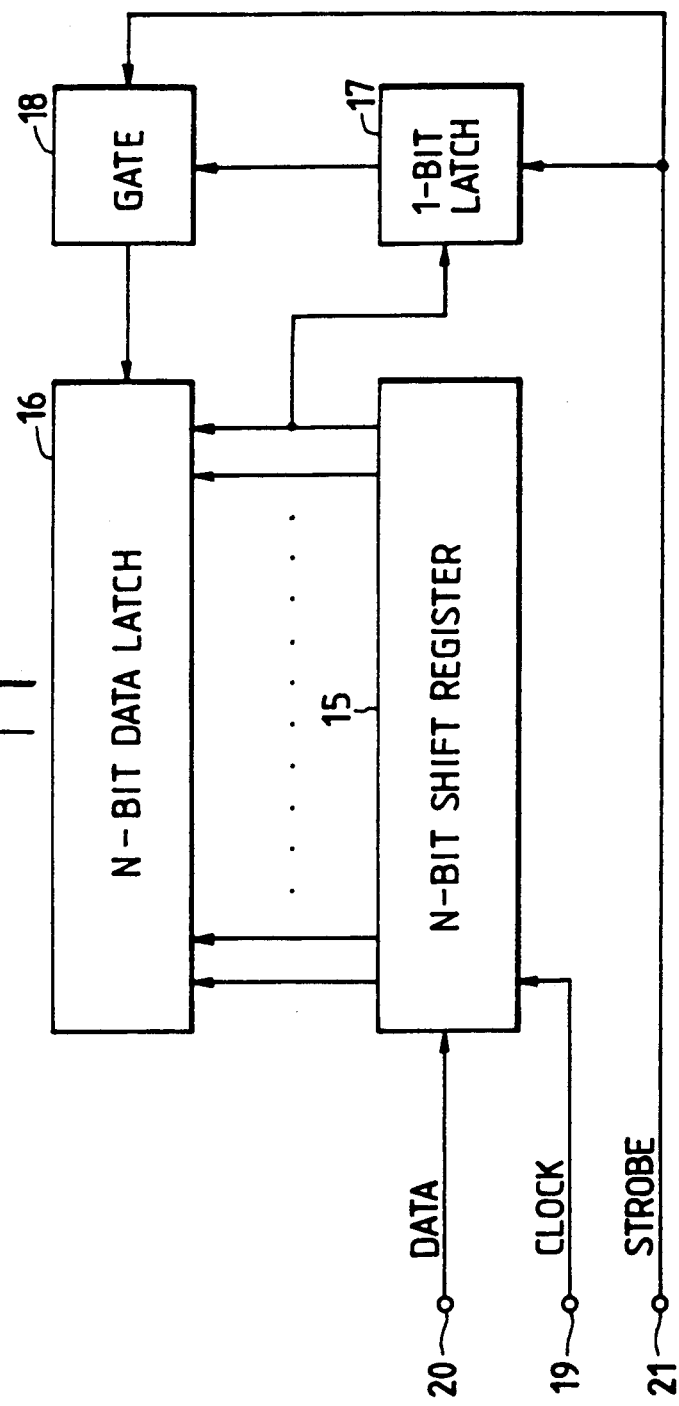
FIG. 2 is a schematic block diagram showing the construction of a data inputting portion which is a principal part of the frequency synthesizer of FIG. 1.

Turning now to FIG. 2, there is shown the construction of the frequency division ratio setting circuit 30 of the frequency synthesizer embodying the present invention shown in FIG. 1. In this figure, reference numeral 15 indicates an N-bit shift register; 16 an N-bit data latch; 17 a 1-bit data latch; and 18 a gate circuit. Moreover, reference numerals 19, 20 and 21 indicate a clock inputting terminal, a data inputting terminal and a strobe signal inputting terminal, respectively.

Hereafter, an operation of the frequency division ratio setting circuit 30 will be described. First, a signal from the data inputting terminal 20 is inputted into the N-bit shift register 15 at the time controlled by a signal from the clock inputting terminal 19. Further, data pushed out from the N-bit shift register 15 are inputted into the 1-bit data latch 17. Both a signal from the strobe signal inputting terminal 21 and an output signal of the 1-bit data latch 17 are controlled by the gate circuit 18. When an output signal of the gate circuit 18 is inputted into a loading terminal of the N-bit data latch 16, outputs of the N-bit data latch 16 are inputted into the variable frequency divider. The frequency synthesizer of the present invention has the foregoing construction and operates as above described. Consequently, strobe signals which have a time difference with each other are synthesized. Thereby, a frequency synthesizer which has strong resistance to noises can be formed.

As above described, in accordance with the present invention, the frequency division ratio setting circuit 30 including the 1-bit data latch 17 and the gate circuit 18 are provided in the data inputting portion of the frequency synthesizer, thereby synthesizing strobe signals. Thereby, the frequency synthesizer of the present invention can have strong resistance to noises at the time of inputting data.

Next, the further detail construction of the phase comparator 3 will be explained by referring to FIGS. 3(a) and 3(b). In these figures, reference numeral 300 indicates as input gate comprising a NAND logical element into which an output signal of the reference frequency divider 2 and a reset signal from the control circuit 9 are inputted; and 310 an input gate comprising a NAND logical element into which an output signal of the variable frequency divider 5 and a reset signal from the control circuit 9 are inputted. Further, reference numerals 320, 330, 340 and 350 indicates state maintaining gates each comprising a NAND logical element. Moreover, reference numeral 360 indicates a NAND element gate by which outputs of the input gate 300 and the state maintaining gates 310, 340 and 350 are NANDed; 370 a NAND element gate by which outputs of the input gate 300 and of the state maintaining gates 340 and of the NAND element gate 360 are NANDed; and 380 indicate a NAND element gate by which outputs of the input gate 300 and of the state maintaining gates 350 and of the NAND element gate 360 are NANDed. Furthermore, reference numeral 390 indicates an inverter outputting a signal $\phi R$ to the charge pump 6; 400 an inverter outputting a signal $\phi V$ to the charge pump 6; and 410 a NAND element gate used for sending phase-state-maintaining information as a lock detection (L. D.) signal.

Next, an operation of the phase comparator 3 will be described hereinbelow with reference to FIGS. 3(a) and 3(b).

Figure 3A:
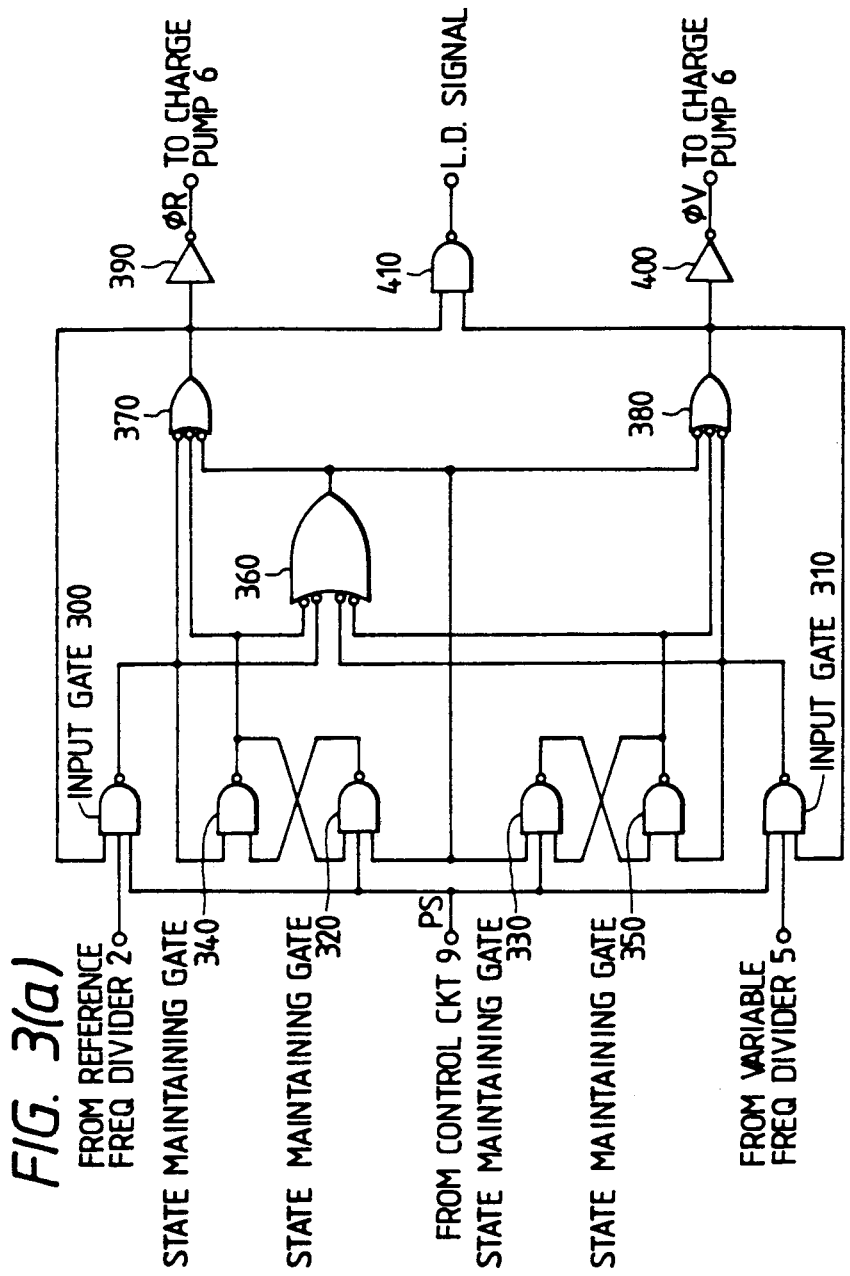
FIG. 3 is a circuit diagram of a phase comparator which is a principal part of the frequency synthesizer of FIG. 1.
Figure 3B:
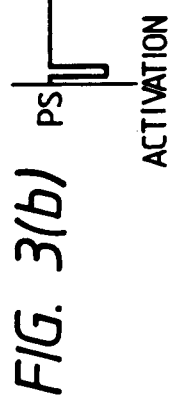
Figure 4:
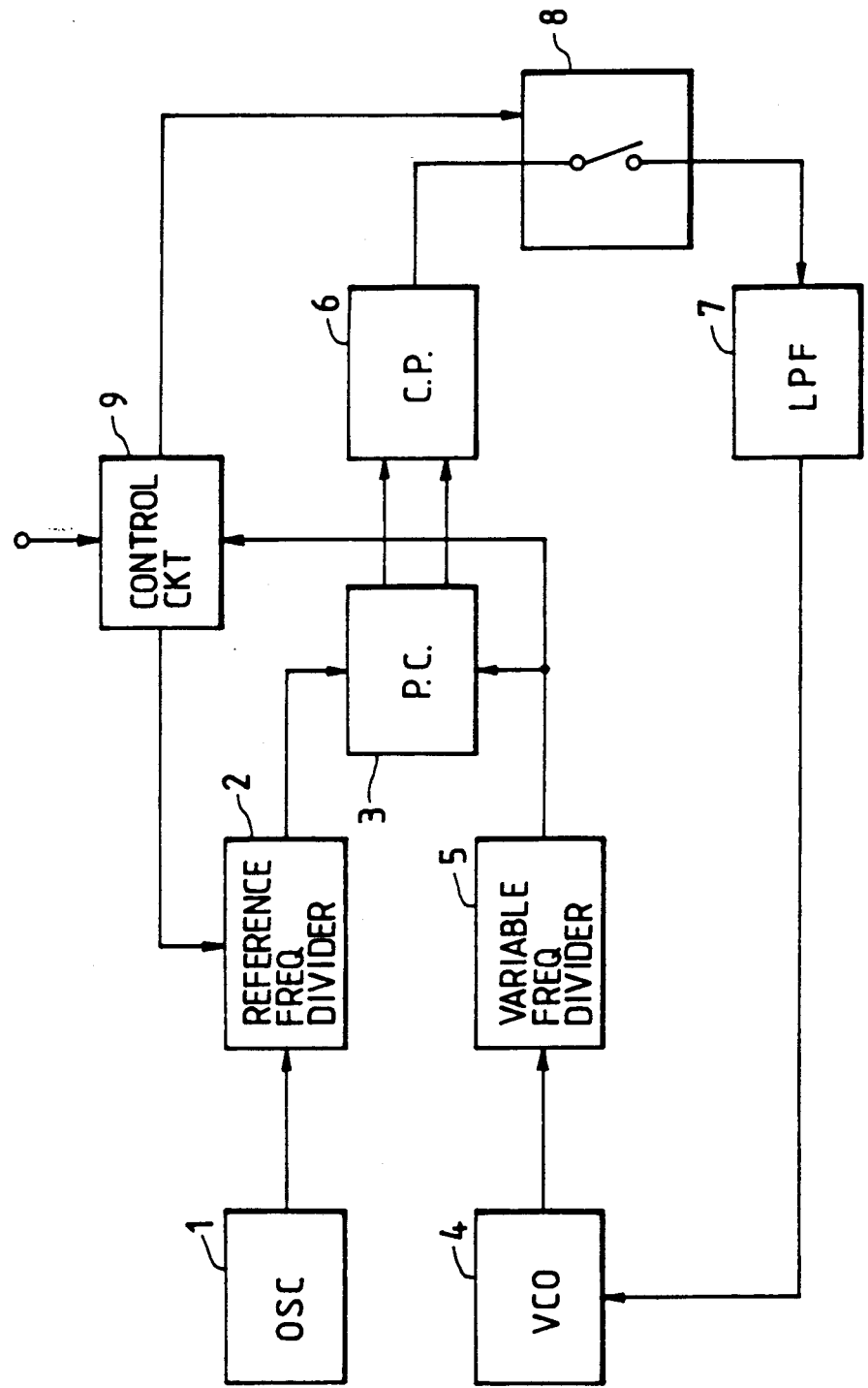
FIG. 4 is a schematic block diagram for showing the construction of a conventional intermittent operating type frequency synthesizer.

First, a reset signal PS is inputted by the control circuit 9 to each of the input gates 300 and 310 and the state maintaining gates 320 and 330 of the phase comparator of FIG. 3(a) at the timing as shown in FIG. 3(b). When the signal PS stands as level "0" after the activation, the level of an output of each of the gates 300, 310, 320 and 330 is forced to "1". Further, the level of an input signal to each of the state maintaining gates 340 and 350 is determined to be also "1". Thus, the level of output signals of the gates 340 and 350 is also determined to be "0". As a result, while the signal PS stands at a level "0", the levels of the output signals $\phi R$ and $\phi V$ of the inverters 390 and 400 are definitely determined to be "0".

Thereafter, the level of the signal PS is changed into "1". Thereby, this frequency synthesizer is put into an ordinary operation mode in which the magnitudes of the outputs signals $\phi R$ and $\phi V$ are determined in accordance with the states of the output signals of the reference frequency divider 2 and the variable frequency divider 5, respectively.

As above stated, in accordance with the present invention, the initial state of the frequency synthesizer is determined by supplying a reset signal to each of the input gates and the state maintaining gates of the phase comparator thereof at the time of activation thereof. Further, the initial phase-locking function of the frequency synthesizer is performed by determining the signals $\phi R$ and $\phi V$, whereby the pulling process can be effected at high speed. Moreover, the present invention is extremely advantageous in that a frequency synthesizer and a phase-locked loop (PLL) type modulator of the radio apparatus which is requested to lower the power consumption thereof can be easily realized.

While a preferred embodiment of the present invention has been described above, it is to be understood that the present invention is not limited thereto. Further, it is to be understood that other modifications will be apparent to those skilled in the art without departing from the spirit of the invention. The scope of the present invention, therefore, is to be determined solely by the appended claims.

What is claimed is:

1. A frequency synthesizer for use in a multichannel radio apparatus, said frequency synthesizer having a first oscillator for outputting a signal having a reference frequency, a first frequency divider for dividing the frequency of the signal outputted from said first oscillator, a second oscillator for outputting a signal having a desired frequency, a second frequency divider for dividing the frequency of the signal outputted by said second oscillator by a variable number, a phase comparator for comparing the phase of the signal outputted from said first frequency divider with that of the signal outputted from said second frequency divider, a charge pump for converting an output signal of said phase comparator and outputting the converted signal as an integrator drive signal and an integrator for integrating the output signal of said charge pump and controlling said second oscillator, the improvement comprising:

a first gate circuit provided between said first oscillator and said first frequency divider;

a second gate circuit provided between said second oscillator and said second frequency divider;

a third gate circuit between said charge pump and said integrator;

a control circuit responsive to an output signal from said first or second frequency divider, a frequency synthesizer controlling signal, and output signals from said phase comparator for producing first and second gate control signals respectively applied to said first and second gate circuits; and a frequency division ratio setting circuit having a shift register, an N-bit data latch responsive to parallel outputs from said shift register, and means for controlling said data latch by logical product of a first signal inputted from a strobe input terminal and a second signal outputted from another data latch which holds a first or last one bit of said parallel outputs of said shift register thereby controlling frequency division ratio of said first and second frequency dividers by outputs of said N-bit data latch.

2. The improvements as set forth in claim 1, wherein said phase comparator comprises input gates and state maintaining gates responsive to a reset signal from said control circuit.

* * * * *